(12) United States Patent
Hoentschel et al.

(10) Patent No.: US 8,574,991 B2
(45) Date of Patent: Nov. 5, 2013

(54) ASYMMETRIC TRANSISTOR DEVICES FORMED BY ASYMMETRIC SPACERS AND TILTED IMPLANTATION

(75) Inventors: Jan Hoentschel, Dresden (DE); Uwe Griebenow, Markkleeberg (DE); Maciej Wiatr, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/417,651

(22) Filed: Mar. 12, 2012

(65) Prior Publication Data

US 2012/0171830 A1 Jul. 5, 2012

Related U.S. Application Data

(62) Division of application No. 12/552,333, filed on Sep. 2, 2009, now Pat. No. 8,158,482.

(30) Foreign Application Priority Data

Sep. 30, 2008 (DE) .......................... 10 2008 049 719

(51) Int. Cl.
*H01L 21/336* (2006.01)

(52) U.S. Cl.
USPC ........... 438/286; 438/290; 438/291; 257/246; 257/408; 257/E21.409; 257/E21.427; 257/E29.266

(58) Field of Classification Search
None
See application file for complete search history.

(56) References Cited

U.S. PATENT DOCUMENTS

| 6,031,268 | A | 2/2000 | Hiroki et al. | 257/345 |
|---|---|---|---|---|
| 6,083,794 | A | 7/2000 | Hook et al. | 438/286 |
| 6,344,396 | B1 * | 2/2002 | Ishida et al. | 438/286 |
| 6,794,256 | B1 | 9/2004 | Fuselier et al. | 438/286 |
| 2004/0087094 | A1 | 5/2004 | Wristers et al. | 438/302 |
| 2005/0035404 | A1 | 2/2005 | Yu et al. | 257/336 |
| 2006/0043430 | A1 | 3/2006 | Feudel et al. | 257/213 |
| 2007/0080401 | A1 | 4/2007 | Yang | 257/346 |
| 2008/0119023 | A1 * | 5/2008 | Lin et al. | 438/279 |
| 2008/0166849 | A1 | 7/2008 | Yang et al. | 438/305 |
| 2008/0185662 | A1 | 8/2008 | Yang | 257/386 |

FOREIGN PATENT DOCUMENTS

DE 102005009023 A1 9/2006

OTHER PUBLICATIONS

Translation of Official Communication from German Patent Office for German Patent Application No. 10 2008 049 719.3 dated Jul. 30, 2009.

* cited by examiner

*Primary Examiner* — Yasser Abdelaziez
(74) *Attorney, Agent, or Firm* — Williams, Morgan, & Amerson, P.C.

(57) ABSTRACT

An asymmetric transistor configuration is disclosed in which asymmetric extension regions and/or halo regions may be combined with an asymmetric spacer structure which may be used to further adjust the overall dopant profile of the asymmetric transistor.

13 Claims, 6 Drawing Sheets

ASYMMETRIC TRANSISTOR DEVICES FORMED BY ASYMMETRIC SPACERS AND TILTED IMPLANTATION

CROSS-REFERENCE TO RELATED APPLICATION

This is a divisional of co-pending application Ser. No. 12/552,333, filed Sep. 2, 2009.

BACKGROUND OF THE INVENTION

1. Field of the Invention

The present disclosure generally relates to the fabrication of integrated circuits, and, more particularly, to the adjustment of characteristics of individual field effect transistor elements by providing an asymmetric transistor architecture.

2. Description of the Related Art

Integrated circuits typically include a large number of individual circuit elements, such as transistors, capacitors, resistors and the like. These individual circuit elements are electrically connected according to the desired circuit layout by respective conductive lines, which are mainly formed in separate "wiring" layers that are typically referred to as metallization layers. For enhancing the performance of the integrated circuit, usually the number of individual circuit elements is increased, thereby obtaining a more complex functionality of the circuit, and associated therewith the feature sizes of the individual circuit elements are reduced, thereby enhancing performance of the individual circuit elements, in particular of the transistors, which represent the dominant components in complex circuits. Generally, a plurality of process technologies are currently practiced, wherein, for logic circuitry, such as microprocessors, storage chips and the like, MOS technology is presently the most promising approach due to the superior characteristics in view of operating speed, manufacturing costs and/or power consumption. During the fabrication of complex integrated circuits using MOS technology, millions of transistors, i.e., N-channel transistors and/or P-channel transistors, are formed in and on an appropriate crystalline semiconductor material, wherein, currently, the vast majority of logic circuitry is fabricated on the basis of silicon. Typically, a MOS transistor, irrespective of whether an N-channel transistor or a P-channel transistor is considered, comprises so-called PN junctions that are formed at an interface of highly doped drain and source regions with a channel region disposed between the drain region and the source region, wherein the channel region is inversely or weakly doped with respect to the drain and source regions. The conductivity of the channel region, which represents an essential device criterion as the reduced current drive capability of scaled devices with reduced transistor width has, at least partially, to be compensated for by an increased conductivity, is controlled by a gate electrode formed above the channel region and separated therefrom by a thin insulating layer. The conductivity of the channel region depends on the dopant concentration, the mobility of the charge carriers and, for a transistor width, the distance between the source and drain regions, which is also referred to as channel length. In addition to the conductivity of the channel region in the saturated state and the linear operating state of the transistor, performance is also significantly influenced by the transistor's capability of rapidly creating a conductive channel in the channel region upon application of a specified control voltage to the gate electrode, since usually the transistors are operated in a switched mode requiring a fast transition from the transistor on-state to the transistor off-state and vice versa. Moreover, other aspects also have to be taken into consideration when designing a transistor of high performance circuit. For instance, static and dynamic leakage currents may significantly affect the overall performance of an integrated circuit, as the achievable amount of heat dissipation that is required for transistor architectures producing high dynamic and/or static leakage currents may restrict the maximum practical operating frequency.

Furthermore, sophisticated lateral and vertical dopant profiles may be required in the drain and source regions to maintain controllability of the channel region for a channel length of approximately 50 nm and significantly less, as is typically applied in modern transistor elements. As is well known, short channel effects may require a reduction of the thickness of the gate insulation layer which, however, may no longer be a viable option on the basis of silicon dioxide since, at a thickness of approximately 1 nm, significant leakage currents may occur, as explained above. Appropriate design countermeasures, on the other hand, may be accompanied by a reduction of channel conductivity, which has resulted in advanced strain engineering techniques for creating a desired type of strain in the channel region which may enhance charge carrier mobility therein. For example, for a standard crystallographic orientation of a silicon layer, i.e., a (100) surface orientation with the channel length directed along a <110> crystal axis, creating a tensile strain along the channel length direction may significantly enhance electron mobility, which thus leads to increased drive current capability of an NMOS transistor. Thus, a plurality of interdependent factors may finally determine the overall transistor characteristics, as will be described in more detail with reference to FIGS. 1a-1b.

FIG. 1a schematically illustrates a cross-sectional view of a transistor element 100 at an early manufacturing stage. As illustrated, the transistor element 100 comprises a substrate 101, above which is formed a silicon-based semiconductor layer 102. The semiconductor layer 102 and the substrate 101 may be separated by a buried insulating layer 103, thereby providing a silicon-on-insulator (SOI) configuration. An SOI transistor architecture may have certain advantages relative to a "bulk" configuration in which the semiconductor layer 102 may represent an upper portion of a substantially crystalline substrate material so that electrical isolation between different transistors may require corresponding deep well regions and the like. On the other hand, in an SOI configuration, the buried insulating layer 103 may provide the vertical insulation, while appropriate isolation structures, such as shallow trench isolations (not shown), may laterally enclose the transistor 100, thereby laterally insulating the transistor 100 from neighboring circuit elements. For instance, by appropriately designing respective drain and source regions, the junction capacitance of the corresponding PN junctions may be reduced compared to bulk devices, thereby also providing enhanced operating speed. Furthermore, in the manufacturing stage shown, a gate electrode structure 104 is formed on the semiconductor layer 102 and comprises a gate insulation layer 104A, separating a gate electrode 104B from a portion of the semiconductor layer 102, which may be referred to as channel region 102A. The gate electrode structure 104 further comprises a dielectric material or spacer elements 104C formed on sidewalls of the gate electrode 104B.

The transistor 100 as shown in FIG. 1a may be formed on the basis of the following well-established process techniques. The semiconductor layer 102 may be formed on the buried insulating layer 103 on the basis of well-established techniques, such as wafer bond processes and the like. Thereafter, photolithography, etch and deposition processes may be performed to define the lateral dimensions of an active region within the semiconductor layer 102 for the transistor 100 by providing appropriate isolation structures, as previously explained. Thereafter, implantation processes may be performed to position one or more dopants within the semiconductor layer 102 to thereby form a specified vertical dopant profile (not shown) according to the transistor characteristics of the device 100, which may finally result in a specified vertical dopant profile in the channel region 102A. Next, material layers for the gate insulation layer 104A and the gate electrode 104B may be formed, for instance, by advanced oxidation and/or deposition techniques for the gate insulation material and by advanced low pressure chemical vapor deposition (CVD), if a polycrystalline silicon material is used. Thereafter, highly sophisticated lithography and etch techniques may be employed to pattern the gate electrode material and the gate dielectric material to form the gate electrode 104B and the gate insulation layer 104A on the basis of a desired design gate length, which may be 50 nm and less in sophisticated applications. Subsequently, a complex implantation sequence may be performed to prepare the semiconductor layer 102 for establishing a desired vertical and lateral dopant profile adjacent to the channel region 102A. For this purpose, a so-called pre-amorphization implantation process 105 is performed during which a non-doping ion species, such as germanium and the like, may be implanted into the semiconductor layer 102 so as to substantially completely destroy the crystalline lattice structure down to a specified depth, thereby forming substantially amorphized regions 106. During the implantation process 105, the process parameters, such as implantation energy for the species under consideration and the ion beam current, may be adjusted to obtain sufficient lattice damage in the region 106, which may reduce channeling effects during a subsequent implantation process and which may also enhance the re-crystallization and activation of dopant atoms. Thereafter, the further processing may be continued by introducing dopant species in order to define respective drain and source regions and the corresponding lateral and vertical shape and the respective dopant gradients at the PN junctions. For example, a dopant species generating the same conductivity type as the basic doping in the semiconductor layer 102 may be introduced by any appropriate implantation techniques, possibly by using a tilt angle in order to form so-called halo regions (not shown) to enable an adjustment of the dopant gradient in combination with a dopant species of opposite conductivity type that may be introduced for forming drain and source regions.

FIG. 1b schematically illustrates the device 100 in a substantially completed manufacturing state. Thus, the device 100 may comprise a source region 108, which may include an extension region 108E, i.e., a shallow doped region connecting to the channel region 102A, thereby defining a PN junction with this region, when enrichment type transistors are considered. In the example shown, the transistor 100 may be assumed to represent an N-channel transistor so that the channel region 102A may be lightly P-doped, while the source region 108 and a drain region 107 are heavily N-doped. As illustrated, the drain region 107 may also include an extension region 107E which may have a symmetric configuration with respect to a lateral offset or overlap with respect to the gate electrode 104B. In this case, the terms drain and source may be interchangeable and may be defined by respective voltages supplied to the transistor 100 during operation. Furthermore, the source and drain regions 108, 107 may comprise deeper portions 108D, 107D which may extend down to the buried insulating layer 103, thereby providing a reduced junction capacitance, as previously explained. In the manufacturing stage shown, the drain and source regions 107, 108 may be in a substantially crystalline state so that the previously created substantially amorphized portions 106 are re-grown in a substantially crystalline state. Furthermore, the device 100 may comprise a spacer structure 109 which may include one or more individual spacer elements 109A, 109B, possibly in combination with respective etch stop materials 109C, 109D. For example, the spacer elements 109A, 109B may be comprised of silicon nitride, while the etch stop liners 109C, 109D, if provided, may be comprised of silicon dioxide. Furthermore, the gate electrode structure 104 may comprise a metal silicide region 104D, which may be formed commonly with metal silicide regions 110 provided in the drain and source regions 107, 108.

The extension regions 107E, 108E may be formed by an ion implantation process within the substantially amorphized regions 106, as previously explained, possibly in combination with respective halo implantation processes so as to obtain the desired dopant gradient. Thereafter, in some manufacturing strategies, the device 100 may be annealed to activate the dopants in the extension regions 107E, 108E, while, in other cases, the process may be continued by forming the spacer structure 109, or at least a portion thereof. For example, the etch stop liner 109C may be deposited, followed by the deposition of a silicon nitride material, which may subsequently be patterned in order to obtain the spacer element 109A. Using the gate electrode structure 104 and the spacer element 109A as an implantation mask, a further portion of the deep drain and source regions 107D, 108D may be formed on the basis of appropriately set implantation parameters. Thereafter, the spacer element 109B may be formed, possibly using the etch stop liner 109D, and a further portion of the deep drain and source regions 107D, 108D may be provided by ion implantation. Next, the device 100 may be annealed to activate the dopant introduced by the preceding implantation sequences, thereby placing a high amount of dopant atoms at lattice sites, while also substantially re-crystallizing implantation-induced lattice damage. For example, if the anneal process may represent the first anneal process of the manufacturing sequence, the extension regions 107E, 108E may also be activated and the previously substantially amorphized regions 106 may be re-crystallized. During the anneal process, a desired final lateral offset or overlap of the extension regions 107E, 108E with the gate electrode 104B may be adjusted, while the vertical dopant concentration may be driven down to the buried insulating layer 103. That is, during the anneal cycle, thermally induced diffusion of the dopants occurs in accordance with the respective concentration gradient of the dopant species under consideration, thereby substantially determining the finally obtained size and characteristics of the drain and source regions 107, 108. Thereafter, the manufacturing process may be continued with the formation of the metal silicide regions 110, 104D which may be accomplished by depositing a refractory metal and initiating a chemical reaction with the underlying silicon material. Subsequently, an interlayer dielectric material may be formed and respective contacts may be provided to provide electrical connections to the drain and source regions 107, 108 and the gate electrode structure 104. For convenience, these components are not shown in FIG. 1b.

During operation of the device 100, typically, a supply voltage is applied to the drain region 107 and the source region 108, for example approximately 1.5-5.0 volts for typical CPUs, while a corresponding control voltage is applied to the gate electrode 104B in order to define the status of the channel region 102A. For an N-channel enhancement transistor, upon application of a control voltage to the gate electrode 104B below a specified threshold voltage which is determined, among other things, by the vertical dopant profile within the channel region 102A, the transistor 100 is in an off-state, that is, the channel region 102A is not conductive and one of the PN junctions is reversed bias. However, during the off-state, the moderately high electrical field prevailing at the drain side, and in particular at the overlap between the extension region 107E and the gate electrode 104B, may lead to tunnel currents into the gate electrode 104B, especially when the gate insulation layer 104A has a thickness of approximately 2 nm and less. These currents may be considered as static leakage currents and may significantly contribute to overall power consumption in sophisticated devices. Moreover, the extension region 107E and the gate electrode 104B may define a capacitor which has to be charged and discharged when operating the transistor 100 in a switched mode, wherein the transistor 100 may also transit through a linear operating mode in which the drain current may be substantially proportional to the effective gate voltage that is determined by the charge state of the corresponding parasitic capacitor.

When applying a control voltage that is above the threshold voltage, a conductive channel is formed in the channel region 102A originating from the source extension region 108E and terminating at the drain extension region 107E. For building up a conductive channel, in the present case created by electrons, an overlap at the source side and a steep concentration gradient at the source side may be advantageous in obtaining a high drive current. However, the steep concentration gradient at the drain side may result in increased creation of electron hole pairs, thereby increasingly creating holes at the body region of the transistor 100, i.e., in the region between the deep drain and source regions 107D, 108D. The accumulated charge carriers may have to be discharged, thereby also contributing to increased dynamic leakage currents. Moreover, during the formation of the conductive channel, the parasitic capacitance caused by the overlapping extension regions 107E, 108E may require high currents for recharging the parasitic capacitor and may thus delay the start of the on-state so that, during the substantially linear operating mode, when charging the parasitic capacitor, a moderately high on resistance may be observed in the transistor 100.

For this reason, asymmetric transistor configurations with respect to the drain and source regions have been proposed, for instance, by providing a certain offset between the drain extension region 107E and the gate electrode 104B in order to enhance overall transistor performance.

Typically, the asymmetric transistor configuration may be obtained on the basis of a tilted implantation process in order to introduce the dopant species for the extension regions 107E differently at the drain side and the source side of the transistor, for instance so as to obtain an increased overlap at the source side of the transistor to provide enhanced charge carrier injection, while a reduced overlap or even a certain offset at the drain side may provide a reduced vertical electric field strength, thereby reducing hot carrier injection. Although the provision of an asymmetric transistor configuration may be a promising approach for enhancing overall transistor performance for given critical dimensions, it turns out that the potential of appropriately designing the drain and source regions, i.e., the corresponding dopant profiles, may not fully be taken advantage of on the basis of conventionally used tilted implantation techniques.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure relates to methods and transistor devices in which performance may be enhanced on the basis of an asymmetric configuration that may be obtained by appropriately adjusting an offset and/or an overlap of extension regions and counter doped regions, also referred to as halo regions, in combination with a specific asymmetric adaptation of deeper drain and source areas on the basis of an asymmetrically provided sidewall spacer structure. Due to the enhanced control of the asymmetric configuration of the drain and source regions in general, increased charge carrier mobility and thus current drive capability of the transistor structures may be accomplished while reducing disadvantages that are typically associated with other sophisticated approaches, which may rely on a further reduction of gate length, increase of channel doping and the like. Consequently, by appropriately designing the overall configuration of an integrated circuit, a plurality of transistors may be provided in performance driven circuit portions, which may be used in a "non-symmetric" manner with respect to the drain and source of the transistors, thereby allowing the usage of an asymmetric transistor configuration providing significant advantages during operation, while not unduly contributing to process complexity. That is, in corresponding circuit layouts, critical transistor elements may be identified which may be operated in such a manner that the function of drain and sources of the transistors may not change during operation of the integrated circuit. In other cases, a corresponding redesign may be used to enable "use" of a plurality of asymmetric transistors, in particular in speed critical signal paths, wherein a corresponding finely tuned asymmetric configuration based on tilted implantation processes in combination with asymmetrically provided spacer structures may result in a significant overall gain in performance. On the other hand, transistors in which the function of drain and source may be interchanged during operation, such as pass gates of memory cells and the like, may be maintained with a symmetrical configuration and may not directly be coupled to asymmetric transistors. Consequently, for a given technology standard and based on established process techniques for individual process steps, a significant gain in performance of N-channel transistors, P-channel transistors and thus for CMOS devices as a whole may be achieved.

One illustrative method disclosed herein relates to forming a transistor. The method comprises introducing at least one dopant species into an active region so as to have a first lateral spatial relation with respect to an edge of a gate electrode at a drain side and having a second lateral spatial relation with respect to an edge of the gate electrode at a source side, wherein the first and second lateral spatial relations are different from each other. The method further comprises forming a spacer element on a first sidewall of the gate electrode at the drain side and forming a second spacer element on a second sidewall of the gate electrode at the source side, wherein the first and second spacer elements have a different width. Finally, the method comprises forming asymmetric drain and source regions on the basis of the first and second spacer elements.

A further illustrative method disclosed herein comprises performing an implantation process on the basis of a non-zero tilt angle to form, in a semiconductor region, asymmetric counter doped regions and/or extension regions of drain and source regions of a transistor, wherein the semiconductor region has formed thereabove a gate electrode. The method further comprises asymmetrically forming a spacer element on sidewalls of the gate electrode and forming deep drain and source areas of the drain and source regions on the basis of the spacer element.

One illustrative semiconductor device disclosed herein comprises a transistor element. The transistor comprises a gate electrode formed above a semiconductor region and a first spacer structure formed on a first sidewall of the gate electrode at a drain side of the transistor. Moreover, a second spacer structure is formed on a second sidewall of the gate electrode at a source side of the transistor. Additionally, the transistor comprises a drain extension region and a source extension region formed in the semiconductor region so as to define a channel region below the gate electrode, wherein the drain extension region has a first offset or a first overlap with respect to the gate electrode at the drain side and wherein the source extension region has a second offset or a second overlap with respect to the gate electrode at the source side, wherein the first offset or first overlap differs from the second offset or second overlap.

BRIEF DESCRIPTION OF THE DRAWINGS

The disclosure may be understood by reference to the following description taken in conjunction with the accompanying drawings, in which like reference numerals identify like elements, and in which.

Figure 1A:
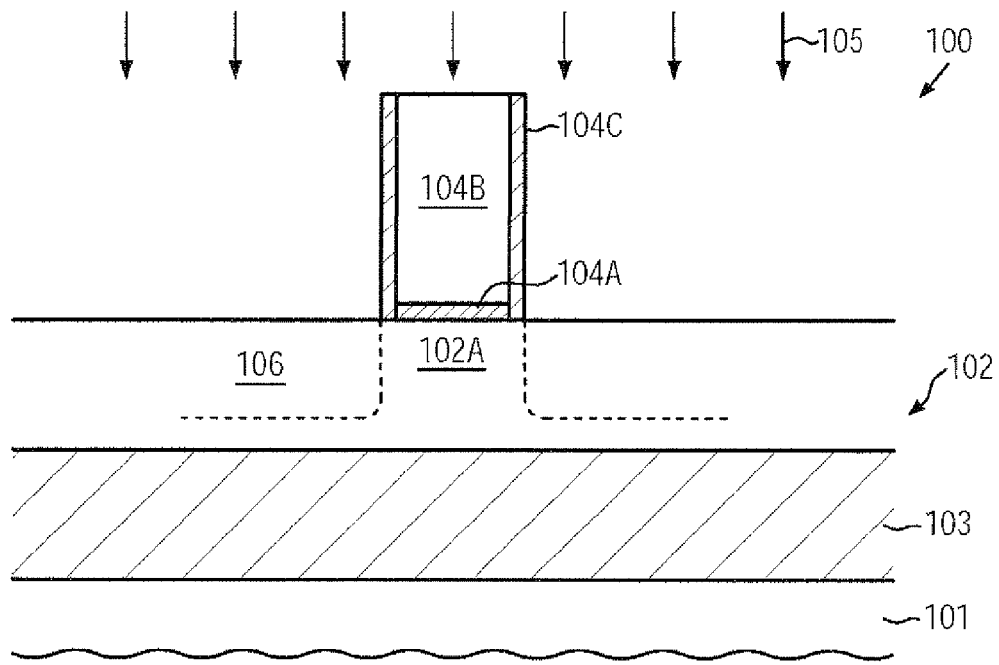
FIGS. 1a-1b schematically illustrate cross-sectional views of a conventional transistor element during various manufacturing stages, wherein symmetric drain and source regions are formed on the basis of a complex manufacturing sequence resulting in an inferior performance compared to asymmetric transistor configurations.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure provides techniques and semiconductor devices which may enable the increase of transistor performance by providing an asymmetric transistor configuration, wherein the lateral spatial relation of extension regions and/or counter doped or halo regions may be adjusted independently from an asymmetric configuration of deeper drain and source areas, which may be formed on the basis of an asymmetric sidewall spacer structure. In this respect, it should be appreciated that the term "asymmetric" transistor configuration may be understood as referring to a different spatial lateral relation of drain and source regions or portions thereof with respect to the gate electrode structure and/or a difference in the lateral and vertical profile of the dopant concentration. That is, in the following, a symmetric transistor configuration is to be understood as a transistor having drain and source regions which may be substantially symmetric with respect to a section through the transistor along the transistor width direction through a center line of the gate electrode. Similarly, an asymmetric transistor may be understood as a transistor which may have no "mirror symmetry" with respect to the above-specified plane, wherein it should be appreciated that the difference may not only refer to the geometric configuration but may also enclose any differences in materials, dopant concentrations and the like. The principles disclosed herein may be applicable to both N-channel transistors and P-channel transistors so that, in combination, a pronounced gain in performance of CMOS devices may be obtained when corresponding critical transistors may be produced in an asymmetric manner as disclosed herein, which may allow enhancing integrated circuits on the basis of existing designs, while, in other cases, specifically adapted circuit designs may be used to ensure that a plurality of critical transistor elements may be provided in the form of asymmetric elements, while a symmetric transistor configuration may be maintained where necessary. Consequently, for a given technology standard, such as the 65 nm standard, 45 nm standard and beyond, the present disclosure may provide a significant performance gain, substantially without contributing to overall process complexity.

Figure 1B:
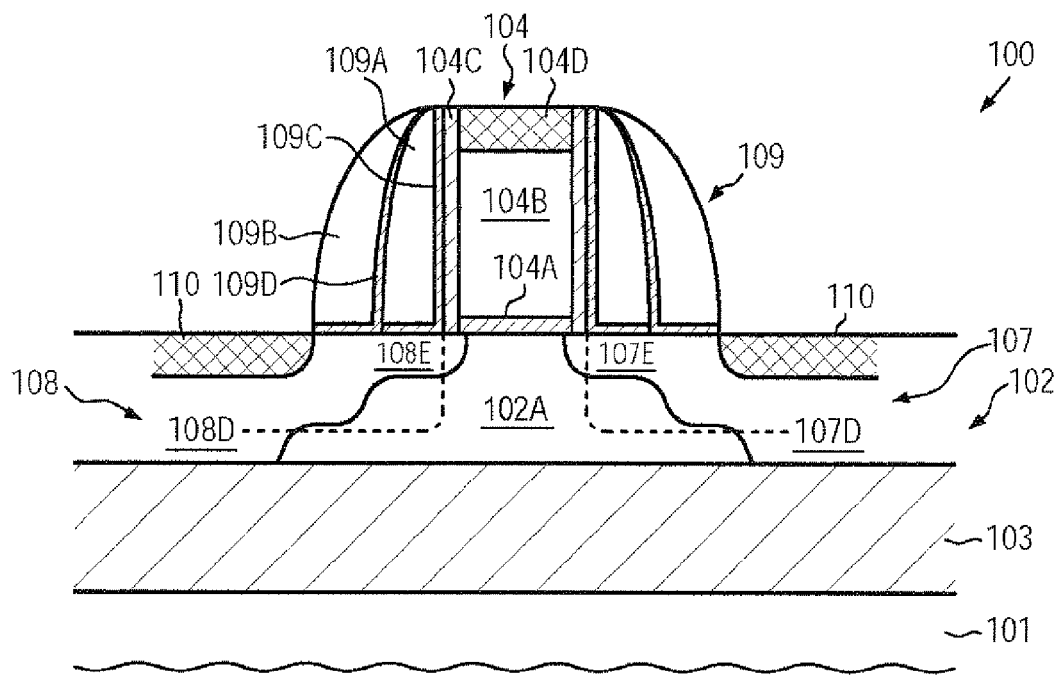

With reference to FIGS. 2a-2j, further illustrative embodiments will now be described in more detail, wherein reference may also be made to FIGS. 1a-1b, if appropriate.

Figure 2A:
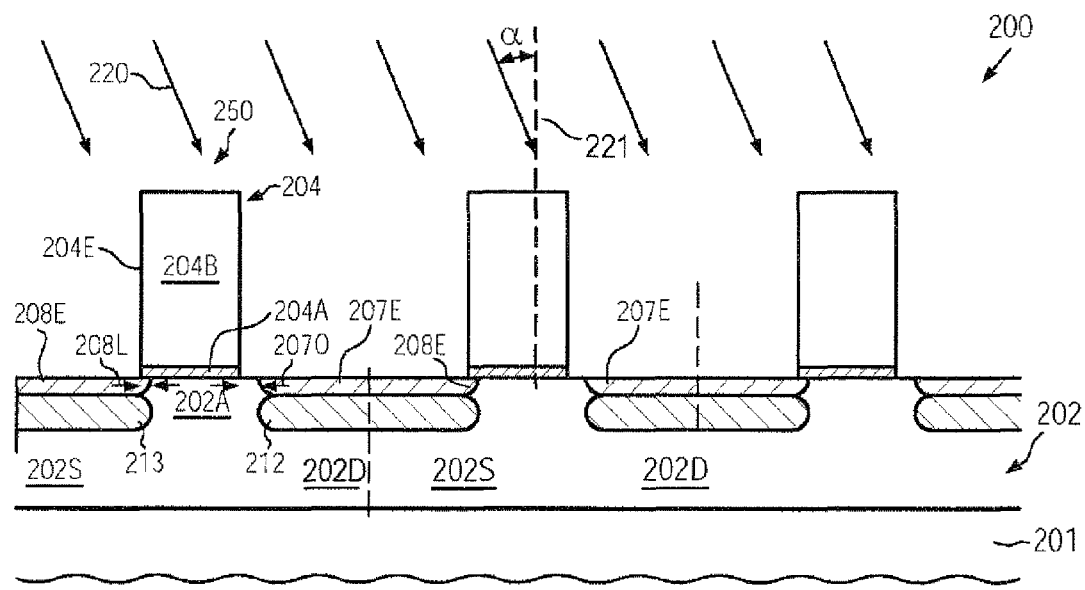
FIG. 2a schematically illustrates a cross-sectional view of a semiconductor device comprising transistors that may receive an asymmetric configuration by introducing dopant species, for instance as required for defining an extension region and/or a counter doped or halo region, on the basis of ion implantation using a non-zero tilt angle, according to illustrative embodiments.

FIG. 2a schematically illustrates a cross-sectional view of a semiconductor device 200 comprising a plurality of transistor elements 250, such as P-channel transistors or N-channel transistors, wherein, for convenience, it may be assumed that the transistors 250 represent transistors of the same conductivity type that are formed in and above a semiconductor region 202, which may also be referred to as an active region. In other cases, the transistors 250 may represent transistors of different conductivity type, which may be formed in the same or different active regions, possibly separated by corresponding isolation structures, wherein a corresponding manufacturing flow with respect to any implantation processes may have to be performed separately, at least for the incorporation of dopant species, in order to produce the different conductivity types. The semiconductor device 200 may further comprise a substrate 201, which may represent any appropriate carrier material for forming thereabove the semiconductor region 202. It should be appreciated that, if required, a buried insulating layer may be formed between the substrate 201 and the semiconductor region 202, as is also described with reference to the device 100 of FIGS. 11-1b. In the manufacturing stage shown, each of the transistors 250 may comprise a gate electrode structure 204 comprising a gate electrode 204B and a gate insulation layer 204A that separates the gate electrodes 204B from the channel region 202A. It should be appreciated that, if required, the gate electrode 204B may have formed on sidewalls thereof an appropriate liner or spacer material, such as a silicon dioxide material, silicon nitride material and the like. Furthermore extension regions 208E, 207E of drain and source regions still to be formed in the semiconductor region 202 are positioned laterally adjacent to each of the gate electrodes 204B, wherein, in the illustrative embodiment shown, the regions 207E, 208E may be provided in an asymmetric manner in the above-defined sense. That is, the extension region 208E at a source side 202S of the region 202 may differ from the extension region 207E at a drain side 202D with respect to a lateral spatial relation to an edge 204E of the gate electrode 204B at the source side 202S compared to a corresponding lateral spatial relation of the region 207E with respect to the corresponding gate edge at the drain side 202D. For example, the extension region 208E may be positioned with respect to the edge 204E so as to define an overlap 208L of the gate electrode 204B, while the extension region 207E may define an offset 207O with respect to the gate electrode 204B. Furthermore, also, the dopant concentration may vary, at least at corresponding portions of the extension regions 208E, 207E that connect to the channel region 202A.

Moreover, in the embodiment shown, counter doped regions 213, 212 are provided at the source side 202S and the drain side 202D, respectively, wherein it should be appreciated that the term "counter doped" is to be understood in relation to the type of doping of the extension regions 207E, 208E or any drain and source areas still to be formed in the semiconductor region 202. In the embodiment shown, the counter doped or halo regions 213, 212 may be provided in an asymmetric manner, i.e., the region 213 may have a specified overlap or offset with respect to the gate electrode 204B, which may differ from a corresponding offset of the region 212 with respect to the gate electrode 204B. It should be appreciated that a corresponding spatial arrangement of the counter doped regions 213, 212, even if provided in an asymmetric manner, may differ from the corresponding spatial arrangement of the extension regions 208E, 207E, as may be desired in accordance with the overall device requirements.

The semiconductor device 200 as shown in FIG. 2a may be formed on the basis of the following processes. After appropriately defining corresponding semiconductor regions, such as the region 202, for instance on the basis of isolation structures (not shown), the gate electrode structure 204 may be formed on the basis of well-established manufacturing techniques, as are also previously discussed with reference to the device 100. Thereafter, an implantation sequence 220 may be performed on the basis of at least one non-zero tilt angle α in order to provide the extension regions 208E, 207E, and the counter doped regions 213, 212. It should be appreciated that a non-zero tilt angle is to be understood as an angle defined between the incoming substantially parallel ion beam of an implantation process and a surface normal 221. Furthermore, as previously discussed with reference to the device 100, the implantation sequence 220 may also comprise an implantation step performed on the basis of any appropriate implantation species, so as to create damage in the semiconductor region 202 down to a specific depth in order to enhance performance of further manufacturing processes, as is also previously explained. In the embodiment shown, the implantation sequence 220 may comprise a tilted implantation step for introducing dopant species for the extension regions 208E, 207E, thereby also providing the overlap 208L at the source side. Due to the shielding effect of the gate electrode 204B, the offset 207O may be obtained, depending on the tilt angle, the height of the gate electrode 204B and possibly of any additional cap materials and the like. Moreover, if a corresponding liner material may be provided on sidewalls of the gate electrode 204B, the corresponding overlap 208L and the offset 207O may also depend on the corresponding layer thickness. Furthermore, a shielding effect of the gate electrode 204B may also result in a somewhat graded dopant concentration in the transition area between the extension regions 208E, 207E and the channel region 202A. Furthermore, the implantation sequence 220 may also comprise a further implantation step performed on the basis of an appropriate dopant species so as to obtain the counter doped regions 213, 212, wherein a non-zero tilt angle may also be used, which may be selected independently from the tilt angle used for the implantation step for forming the extension regions 208E, 207E. By varying the corresponding tilt angle, the asymmetric configuration of the transistors 250 may be adjusted as required for enhanced transistor performance. Furthermore, the sequence of the various implantation steps may be selected so as to comply with the overall process strategy. That is, the implantation step for forming the counter doped regions 213, 212 may be performed prior to or after the corresponding implantation step for forming the extension regions 208E, 207E, wherein, as previously discussed, at any appropriate stage of the implantation sequence 220 an amorphization implantation process may also be performed, for example also based on a tilt angle, depending on the desired overall transistor configuration. It should further be appreciated that a non-tilted implantation step may also be used for forming the extension regions 207E, 208E and/or the halo regions 213, 212 if a corresponding offset may not be desired at the drain side 202D. Moreover, a different overlap on both sides of the gate electrode 204B may be formed, however with different size, if required.

In still other illustrative embodiments (not shown), the implantation sequence 220 may be performed on the basis of an appropriate offset spacer structure which may be provided in an asymmetric manner and which may be formed in accordance with process techniques, as will also be described later on with reference to FIGS. 2b-2f so that, in this case, even a "symmetric" implantation sequence may be used when different offsets at the drain side and the source side 202S, 202D, respectively, may be required. Moreover, tilted implantation steps may also be used in combination with an asymmetric offset spacer structure, if desired.

Figure 2B:
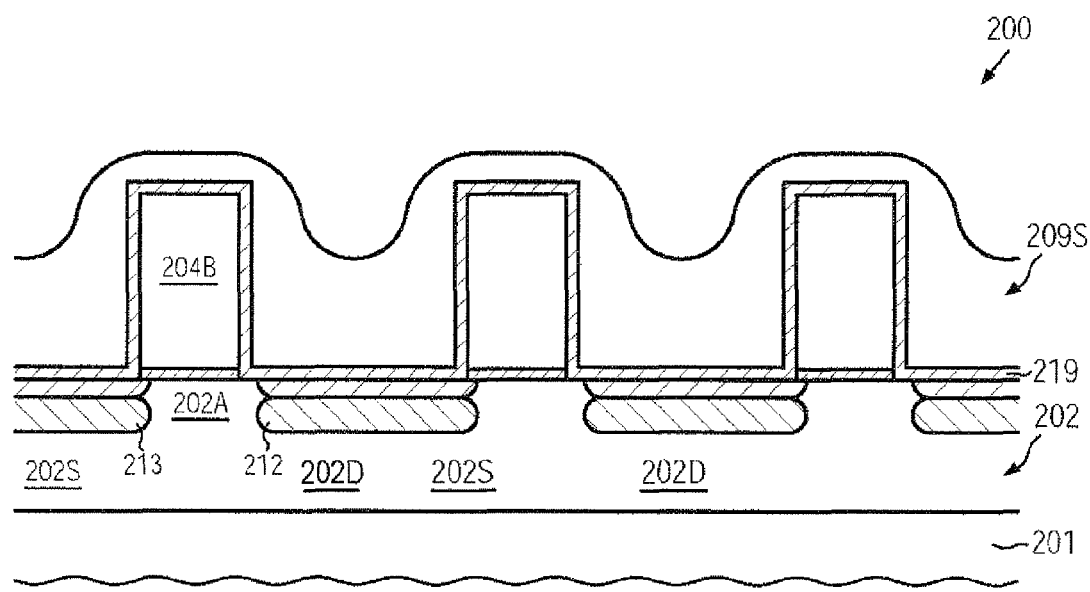
FIGS. 2b-2f schematically illustrate the semiconductor device at various manufacturing stages in forming an asymmetric sidewall spacer structure used to controllably adjust the further definition of deeper drain and source areas, according to still further illustrative embodiments.

FIG. 2b schematically illustrates the semiconductor device 200 in an advanced manufacturing stage in which a spacer material 209S may be formed above the transistor 250, possibly in combination with an etch stop layer 219. For example, the spacer material 209S may be provided in the form of silicon nitride, thereby providing a high degree of compatibility with conventional process strategies. In this case, the etch stop liner 219 may be provided as a silicon dioxide material, since a plurality of highly selective etch recipes are available for silicon nitride and silicon dioxide. It should be appreciated, however, that other material compositions for the layers 209S, 219 may be used, such as silicon dioxide for the spacer material and silicon nitride, silicon carbide and the like for the etch stop liner 219. In other cases, the liner material 219 may be omitted if an etch selectivity between the semiconductor region 202 and the spacer material 209S is considered appropriate. The deposition of the materials 209S, 219 may be accomplished by well-established deposition techniques, such as thermally activated chemical vapor deposition (CVD), plasma enhanced CVD and the like.

Figure 2C:
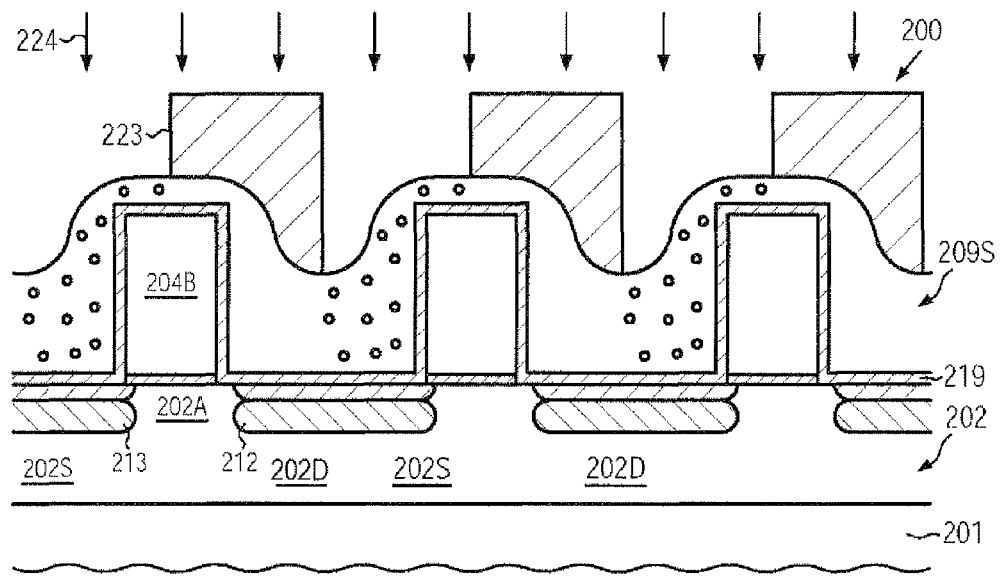

FIG. 2c schematically illustrates the semiconductor device 200 in a further advanced manufacturing stage. As illustrated, an implantation mask 223 may be formed so as to expose a portion of the spacer material 209S at the source side 202S, while covering the spacer material 209S at the drain side 202D of the transistors 250. For this purpose, a corresponding resist material may be deposited and may be appropriately exposed and developed in order to obtain the mask 223. Thereafter, the device 200 may be exposed to an ion bombardment 224, in which the exposed portion of the spacer material 209S may be modified in order to change the etch behavior of the exposed portion, for instance to increase a corresponding removal rate during a subsequent etch process. For this purpose, any appropriate implantation species, such as xenon, krypton and the like, may be used in combination with appropriately selected implantation parameters in order to obtain a desired degree of modification of the spacer material 209S, which may thus exhibit a corresponding asymmetry with respect to its etch behavior in view of the drain sides and source sides 202D, 202S, respectively.

Figure 2D:
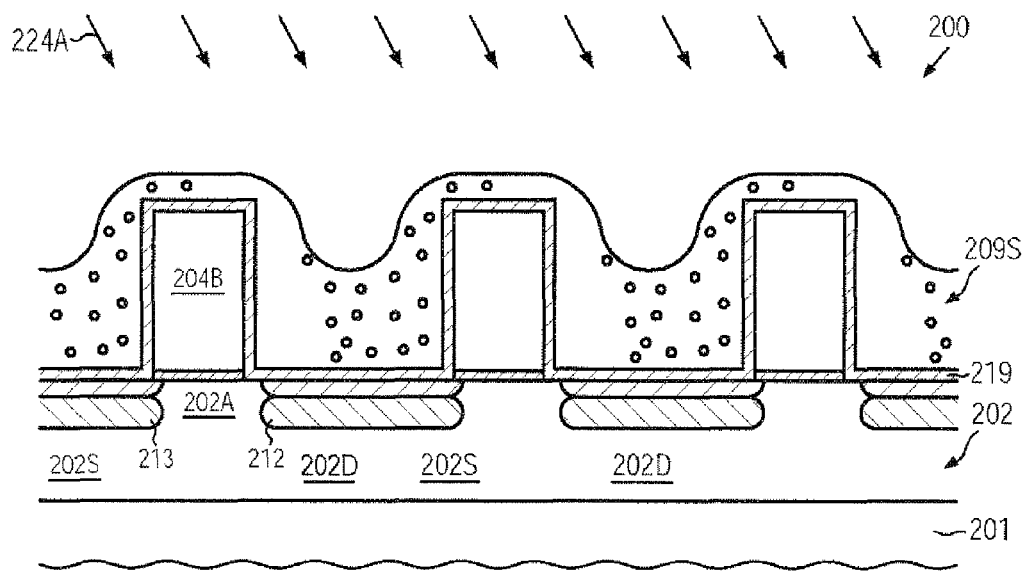

FIG. 2d schematically illustrates the semiconductor device 200 according to still further illustrative embodiments in which an asymmetric modification of the etch behavior of the spacer layer 209S may be accomplished on the basis of a tilted implantation process 224A, in which a corresponding species, such as specified above, may preferably be incorporated at source sides 202S while the shielding effect of the gate electrodes 204B, in combination with the surface topography of the spacer layer 209S, may provide a significantly reduced degree of material modification at the drain sides 202D. Consequently, a corresponding "asymmetric" modification of the etch behavior of the spacer layer 209S may be accomplished without requiring a lithography step for providing a corresponding mask.

In still other illustrative embodiments, an appropriate mask, such as the mask 223 (FIG. 2c), may be provided with or without the implantation process 224 and may be maintained at least temporarily during a subsequent etch process for patterning the spacer layer 209S. For example, in some illustrative embodiments, the corresponding etch mask, such as the mask 223, may be maintained at an initial phase, possibly without preceding implantation processes, thereby increasingly removing material at the source side 202S and, thereafter, the mask 223 may be removed and the patterning of the spacer layer 209S may be continued so as to obtain a total difference in removal rate between the corresponding source sides and drain sides 202S, 202D, respectively. In other cases, the corresponding etch mask 223 may have a predetermined etch rate and may be removed during the etch process for patterning the spacer layer 209S, thereby providing a corresponding delay of the material removal at the drain sides 202D, which may also result in a corresponding asymmetric spacer configuration.

Figure 2E:
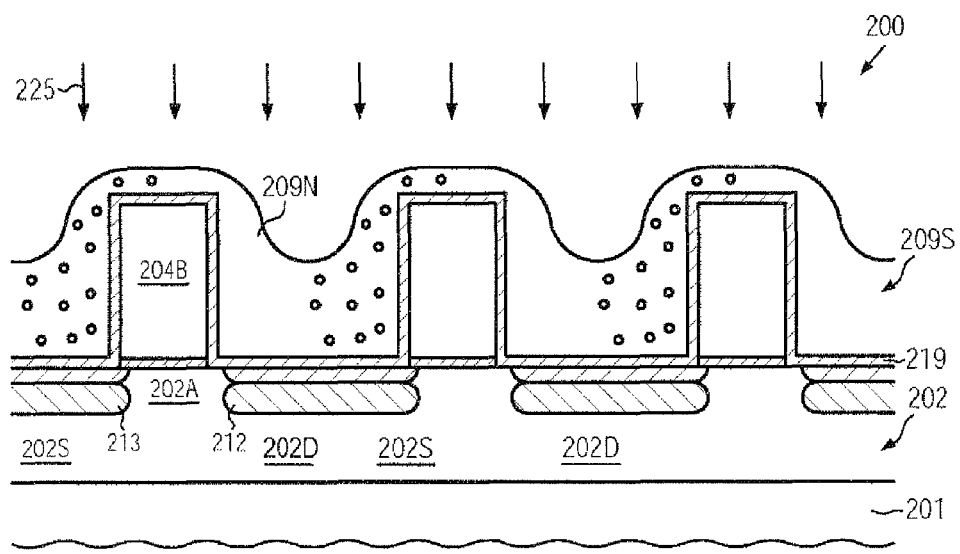

FIG. 2e schematically illustrates the semiconductor device 200 in which the spacer layer 209S may comprise substantially non-modified portions 209N, which may thus have the initial behavior during an etch process 225 that is designed to pattern the spacer layer 209S in order to form asymmetric spacer elements. For example, the substantially non-modified portions 209N may be obtained on the basis of the process techniques as previously described with reference to FIGS. 2c and 2d. In other cases, as previously discussed, the etch process 225 may temporarily be performed on the basis of an additional etch mask so as to obtain a different removal rate at the source sides and the drain sides, respectively. Due to the different removal rate or the etch delay obtained by a corresponding etch mask, the effective lateral removal rate may also be reduced at the source side and may thus result in a corresponding reduced spacer width after the completion of the etch process 225.

Figure 2F:
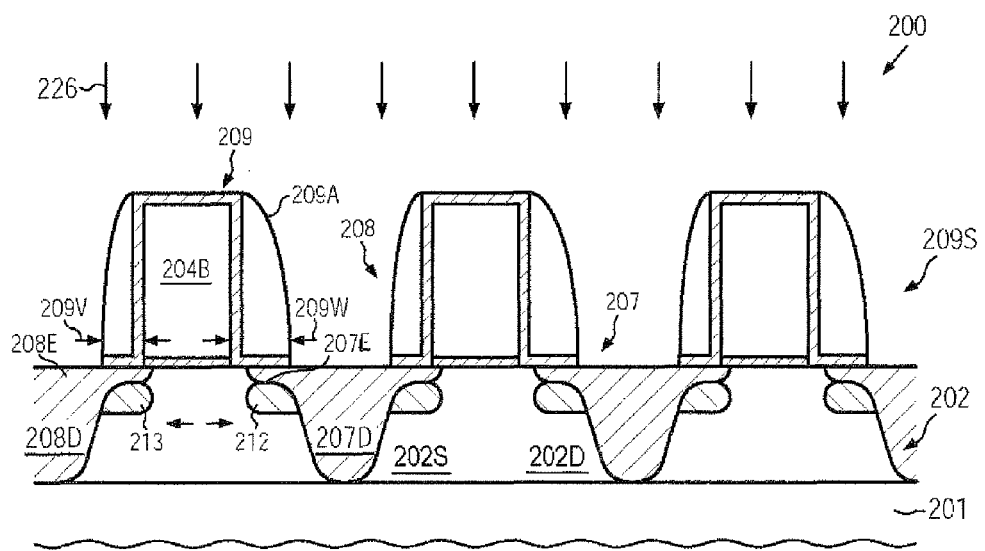

FIG. 2f schematically illustrates the semiconductor device 200 in a further advanced manufacturing stage. As is illustrated, on sidewalls of each of the gate electrodes 204B, a corresponding spacer structure 209 may be formed in an asymmetric manner, that is, a corresponding spacer element 209A may have a different width at the source side 202S compared to the drain side 202D, thereby providing the asymmetric width 209V, 209W of the spacer structure 209. It should be appreciated that instead of denoting the spacer element 209A as a single spacer element that laterally encloses the gate electrode 204B, a corresponding spacer may be considered as two individual spacer elements positioned on both sides of the gate electrode 204B. These spacer elements may be considered as first and second spacer elements of the spacer structure 209. For convenience, hereinafter it may be referred to as a single spacer element which has a different width at the drain side and the source side. Furthermore, the device 200 may be subjected to a further implantation process 226 in order to form deeper drain and source areas 207D, 208D, wherein, due to the asymmetric nature of the spacer structure 209, which acts as an implantation mask, a corresponding asymmetric configuration of these deeper drain and source areas 207D, 208D may be obtained. For example, in the illustrative embodiment, generally, the deeper drain area 207D may have a greater offset with respect to the gate electrode 204B compared to the deeper source area 208D. It should be appreciated that the corresponding offsets may be adjusted on the basis of the different spacer widths 209W, 209V, possibly in combination with corresponding implantation parameters, such as the tilt angle, if used, and the like. In combination with the previously provided extension regions 207E, 208E, and the corresponding counter doped regions 213, 212, a complex dopant profile may be created in the transistors 250, thereby obtaining asymmetric drain and source regions 207, 208, which may provide overall enhanced transistor performance, as is also previously explained.

Figure 2G:
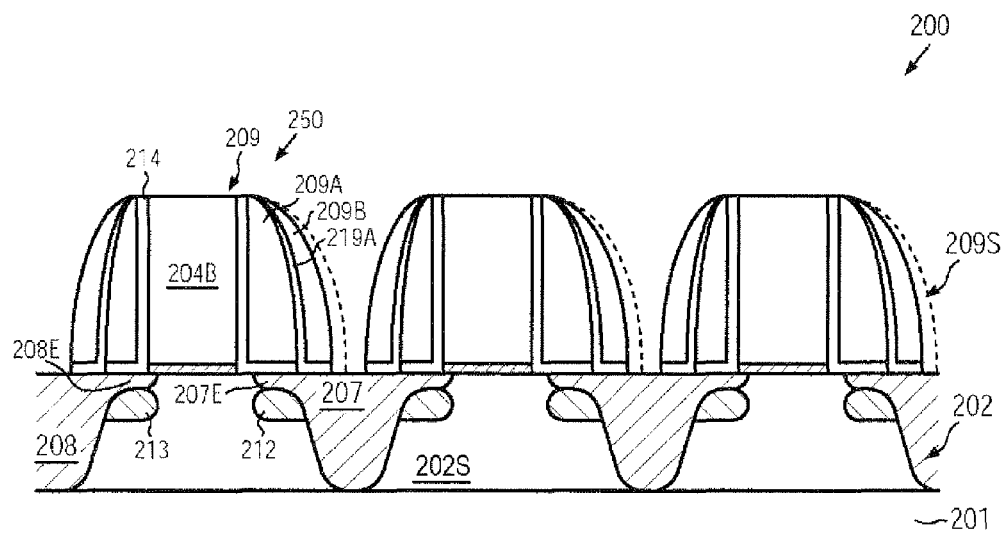
FIG. 2g schematically illustrates the semiconductor device according to further illustrative embodiments in which two or more individual spacer elements may be provided in the asymmetric spacer structure, wherein one or more individual spacer elements may be provided in an asymmetric manner.

FIG. 2g schematically illustrates the semiconductor device 200 according to further illustrative embodiments in which the spacer structure 209 may comprise two or more individual spacer elements 209A, 209B, possibly in combination with corresponding etch stop liners 219A. The asymmetric configuration of the spacer structure 209 may be obtained by providing at least one of the spacer elements 209A, 209B in the form of an asymmetric spacer element, as explained above with reference to FIG. 2f. For instance, the spacer element 209A may be provided as an asymmetric spacer element, as discussed above, while the further spacer elements 209B may be provided in the form of "symmetric" spacer elements if a more pronounced lateral profiling of the drain and source regions 207, 208 may be required, wherein, however, the difference in offset provided by the spacer element 209A may be considered appropriate. In other cases, the spacer element 209B may have an asymmetric configuration, thereby further increasing the asymmetric nature of the spacer structure 209, as indicated by the dashed line. In other cases, the degree of asymmetry of the spacer structure 209, as is accomplished on the basis of the first spacer element 209A, may be reduced by providing the second spacer element 209B as an asymmetric spacer element having an increased width at the source side 202S, if this is considered appropriate for the overall configuration of the transistors 250. In still other illustrative embodiments, the spacer element 209A may be provided in the form of a symmetric spacer element and the spacer element 209B may have a different width in order to obtain a desired difference in offset of corresponding deeper portions of the drain and source regions 207, 208. It should further be appreciated that additional spacer elements may be provided if considered appropriate for the further profiling of the drain and source regions 207, 208. Also, in this case, these further spacer elements may be provided in the form of symmetric or asymmetric spacer elements so as to appropriately adapt the overall configuration of the drain and source regions 207, 208. Consequently, by means of the asymmetric spacer structure 209, possibly comprising two or more individual spacer elements, an efficient tuning of the overall dopant profile may be accomplished, wherein a previously introduced asymmetric configuration of the extension regions 207E, 208E and/or of the counter doped regions 213, 212 may be compensated, increased, reduced and the like, depending on the device requirements. Thus, on the basis of the initial asymmetric configuration of the extension regions 207E, 208E and/or the halo regions 213, 212, which may be obtained by tilted implantations and/or corresponding asymmetric offset spacers (not shown) and the sophisticated spacer techniques described with reference to FIGS. 2c-2g, any appropriate and complex dopant profile may be established in accordance with the overall device requirements.

Figure 2H:
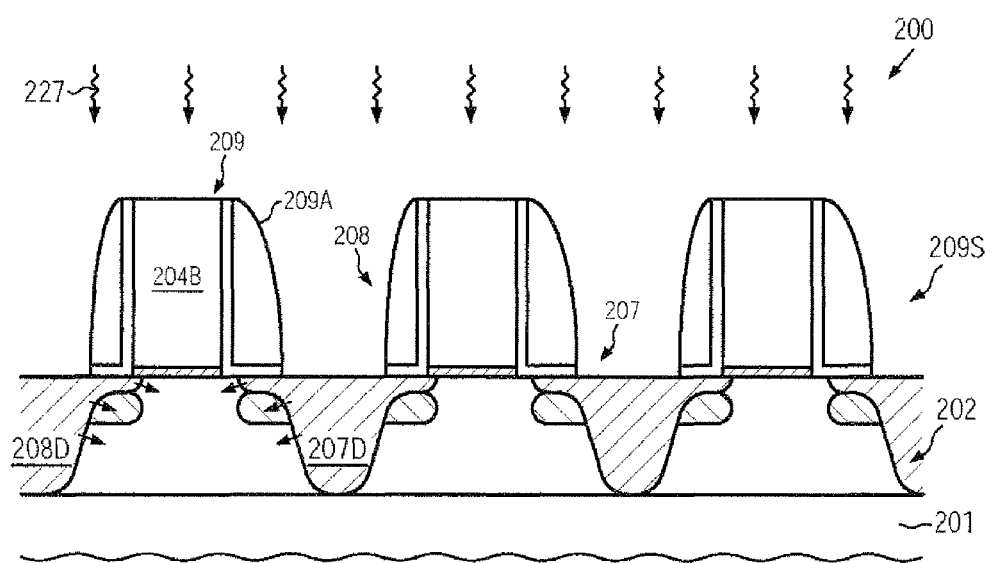
FIGS. 2h-2i schematically illustrate cross-sectional views of the semiconductor device in further advanced manufacturing stages, according to illustrative embodiments.

FIG. 2h schematically illustrates the semiconductor device 200 during an anneal process 227, in which, if desired, an additional adaptation of the final dopant profile may be accomplished by using appropriate anneal techniques and process parameters to induce a specific diffusion of the dopant species, while also activating the dopants and re-crystallizing implantation-induced damage. It should be appreciated that a plurality of process techniques, such as flashlight-based anneal processes, laser-based anneal techniques and the like, may be available, in which the degree of dopant diffusion may be maintained at a low level while nevertheless providing activation and crystallinity of the semiconductor region 202. In other cases, specific dopant diffusion may be desirable to adjust the final channel length and the corresponding dopant gradients at the corresponding PN junctions. Also, in this case, the generally asymmetric configuration of drain and source regions 207, 208 after the entire implantation processes may provide enhanced process results after the anneal process 227.

Figure 2I:
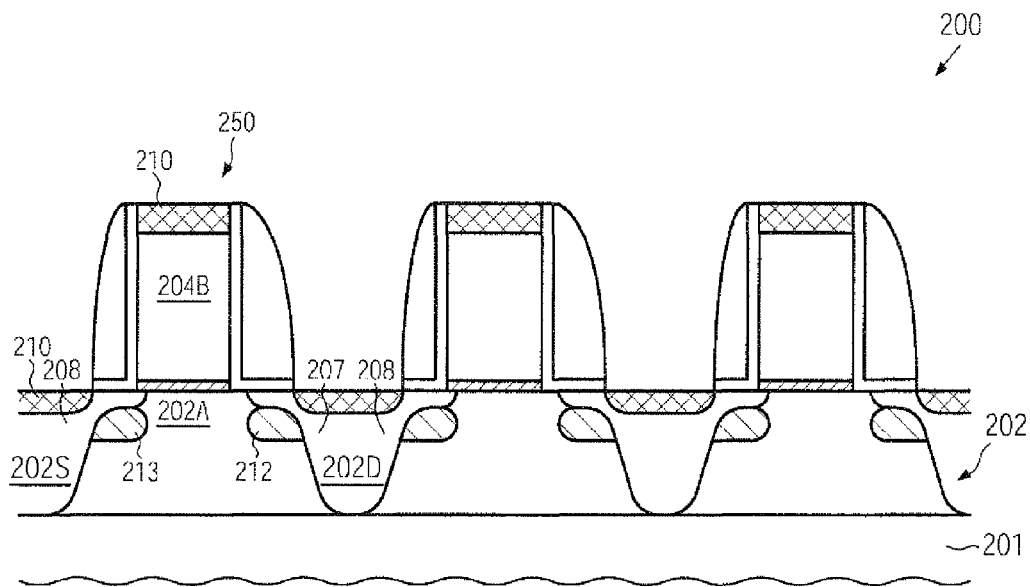

FIG. 2i schematically illustrates the semiconductor device 200 in a further advanced manufacturing stage in which metal silicide portions 210 may be formed in the drain and source regions 207, 208 and in the gate electrodes 204B, which may be accomplished on the basis of well-established process techniques. For example, the metal silicide regions 210 may be formed on the basis of cobalt, nickel, platinum and the like in accordance with device requirements. Thus, the transistors 250 may be provided in an asymmetric configuration having sophisticated drain and source regions 207, 208, thereby increasing overall drive current capability while nevertheless maintaining a high degree of compatibility with conventional CMOS techniques. This may be accomplished by using sophisticated spacer techniques for obtaining an asymmetric spacer configuration in combination with an asymmetric configuration of extension regions and/or counter doped regions, which in turn may be formed on the basis of tilted implantation processes and/or asymmetric offset spacer techniques. It should be appreciated that the transistors 250 are shown so as to have increased overlap at the source side 202S, while a corresponding overlap at the drain side 202D may be reduced or even a specific offset may be maintained, since a corresponding configuration is possibly considered advantageous in providing enhanced charge carrier injection into the channel region 202A, while maintaining charge carrier injection at the drain side at a reduced level. However, the principles disclosed herein may also be readily applied to a specific asymmetric transistor configuration wherein a difference in overlap and/or offset may be produced in any other way in the transistor and may even be created differently at different depth levels of the drain and source regions 207, 208. For instance, an increased overlap may be desired at the source side 202S close to the channel region 202A, while an increased offset may be desired at an increased depth level of the source region 208. On the other hand, it may be desirable to provide a reduced offset at deeper areas of the drain region 207, while immediately at the channel region 202A, a reduced overlap or even a certain offset may be desirable. Also, in this case, a corresponding adaptation may be accomplished on the basis of the above-described techniques.

Figure 2J:
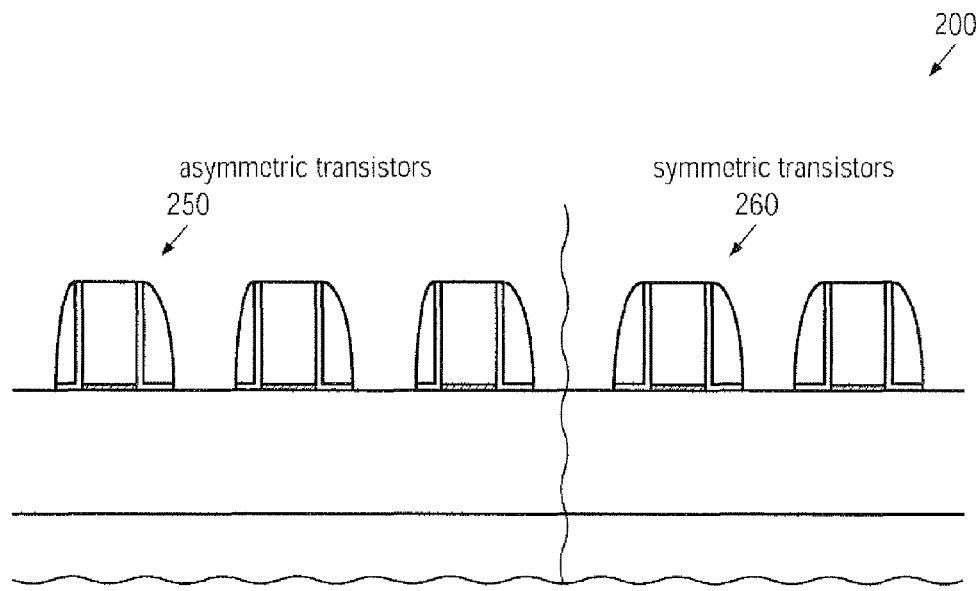
FIG. 2j schematically illustrates the semiconductor device comprising an appropriate overall configuration, in which asymmetric transistors may be used in combination with symmetric transistors in order to enhance overall performance of the entire circuit, according to illustrative embodiments.

FIG. 2j schematically illustrates the semiconductor device 200 according to illustrative embodiments in which a specific circuit design may be used to provide a plurality of asymmetric transistors 250 which may thus provide a significant gain in performance of the device 200, while also symmetric transistors 260 may be used when a symmetric operational behavior of a transistor may be considered advantageous for the overall device performance. For example, the asymmetric transistors 250 may represent speed critical transistor elements in which the function of drain and source regions may not change during speed critical operational phases, while the transistors 260 may frequently be operated with the drain and source functions exchanged. For instance, the symmetric transistors 260 may represent pass gates which may require a symmetric behavior.

As a result, the present disclosure provides semiconductor devices and methods for obtaining an asymmetric transistor architecture by using an asymmetric configuration of drain and source extension regions and/or of counter doped regions or halo regions in combination with an asymmetric configuration of deeper drain and source areas, wherein the asymmetric configuration may be accomplished on the basis of an asymmetric spacer structure, possibly in combination with a tilted implantation sequence. Consequently, an efficient fine tuning of the dopant profile in the drain and source regions may be accomplished with a high degree of compatibility with existing CMOS techniques so that additional process complexity may be substantially avoided or may even be reduced compared to conventional highly sophisticated techniques for adjusting transistor performance in sophisticated semiconductor devices. Consequently, the principles disclosed herein may be advantageously used in the context of sophisticated semiconductor devices including transistor elements having critical dimensions of approximately 50 nm and less, wherein, for a given gate length of the transistors, a significant performance gain may be accomplished, while avoiding or postponing complex process adaptation or new development of materials and processes.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    performing a non-zero tilt angle implantation process to form at least one of asymmetric counter doped regions and asymmetric shallow extension regions of drain and source regions of a transistor in a semiconductor region, said semiconductor region having a gate electrode formed thereabove;
    after forming said at least one of asymmetric counter doped regions and asymmetric extension regions, asymmetrically forming a spacer element on sidewalls of said gate electrode, wherein asymmetrically forming said spacer element comprises depositing a spacer material, covering said spacer material at one of a drain side and a source side of said transistor by an implantation mask, implanting an implantation species so as to modify an etch behavior of an exposed portion of said spacer material and etching said spacer material after removing said implantation mask; and
    forming deep drain and source areas of said drain and source regions using said asymmetrically formed spacer element.

2. The method of claim 1, wherein asymmetrically forming said spacer element further comprises, prior to removing said implantation mask, etching said exposed portion of said spacer material by using said implantation mask as an etch mask.

3. The method of claim 1, further comprising forming one or more further spacer elements on said asymmetrically formed spacer element, wherein said deep drain and source areas are formed by using said one or more further spacer elements.

4. The method of claim 3, wherein at least one of said one or more further spacer elements is formed as an asymmetric spacer element.

5. The method of claim 1, further comprising forming a second transistor in and above a second semiconductor region, said second transistor comprising at least one of substantially symmetric counter doped regions, substantially symmetric shallow source/drain extension regions, substantially symmetric deep source/drain regions, and a substantially symmetric sidewall spacer element.

6. A method, comprising:
    forming a gate electrode above an active region of a transistor element;
    forming asymmetric shallow source and drain extension regions in said active region using said gate electrode as an implantation mask during a non-zero tilt angle implantation sequence;
    forming a layer of spacer material above said gate electrode and said active region;
    forming a patterned implantation mask above said layer of spacer material, said patterned implantation mask exposing a portion of said layer of spacer material adjacent to a first sidewall of said gate electrode and covering a portion of said layer of spacer material adjacent to a second sidewall of said gate electrode;
    performing an ion implantation process using said patterned implantation mask so as to asymmetrically modifying an etch behavior of said layer of spacer material relative to said sidewalls of said gate electrode;
    forming asymmetric spacer structures on sidewalls of said gate electrode by performing an etch process on said layer of spacer material having said asymmetrically modified etch behavior; and
    forming deep source and drain regions in said active region using said asymmetric spacer structures as an implantation mask during a source/drain implantation process.

7. The method of claim 6, further comprising forming asymmetric counter doped regions in said active region during said non-zero tilt angle implantation sequence.

8. The method of claim 6, wherein forming said asymmetric shallow source and drain extension regions comprises forming a first one of said shallow source and drain extension regions having an offset relative to a first respective sidewall of said gate electrode, and forming a second one of said shallow source and drain extension regions having an overlap relative to a second respective sidewall of said gate electrode, wherein a size of said offset is different that a size of said overlap.

9. The method of claim 7, wherein forming said asymmetric counter doped regions comprises forming a first one of said asymmetric counter doped regions having an offset relative to a first respective sidewall of said gate electrode, and forming a second one of said asymmetric counter doped regions having an overlap relative to a second respective sidewall of said gate electrode, wherein a size of said offset is different that a size of said overlap.

10. A method, comprising:
    performing a non-zero tilt angle implantation process to form at least one of asymmetric counter doped regions and asymmetric shallow extension regions of drain and source regions of a transistor in a semiconductor region, said semiconductor region having a gate electrode formed thereabove;
    after forming said at least one of asymmetric counter doped regions and asymmetric extension regions, asymmetrically forming a spacer element on sidewalls of said gate electrode, wherein asymmetrically forming said spacer element comprises depositing a spacer material, covering said spacer material at a first one of a drain side and a source side of said transistor by a mask and using said mask as an etch mask while performing an etch process to etch said spacer material at a second one of said drain side and said source side; and forming deep drain and source areas of said drain and source regions using said asymmetrically formed spacer element.

11. The method of claim 10, wherein asymmetrically forming said spacer element further comprises, after removing a first portion of said spacer material at said second one of said drain side and said source side of said transistor during said etch process, removing said etch mask and thereafter performing a further etch process to etch said spacer layer on both of said first one and said second one of said drain side and said source side.

12. The method of claim 10, wherein asymmetrically forming said spacer element further comprises removing said etch mask during said etch process while etching said spacer material at said second one of said drain side and said source side so as to expose said spacer material at said first one of said drain side and said source side.

13. The method of claim 12, wherein asymmetrically forming said spacer element further comprises, after removing said etch mask during said etch process, continuing said etch process so as to etch said spacer material at said first one of said drain side and said source side.

\* \* \* \* \*